(12) United States Patent
Lovell et al.

(10) Patent No.: US 7,323,816 B2
(45) Date of Patent: Jan. 29, 2008

(54) THICK FILM DIELECTRIC ELECTROLUMINESCENT DISPLAY HAVING PATTERNED PHOSPHOR FILM WITH ELECTRONIC BAND GAP

(75) Inventors: Dave Lovell, Toronto (CA); Terry Hunt, Acton (CA)

(73) Assignee: Ifire Technology Corp, Fort Saskatchewan, Alberta (CA)

( * ) Notice: Subject to any disclaimer, the term of this patent is extended or adjusted under 35 U.S.C. 154(b) by 0 days.

(21) Appl. No.: 11/000,732

(22) Filed: Dec. 1, 2004

(65) Prior Publication Data

US 2005/0231105 A1    Oct. 20, 2005

Related U.S. Application Data

(62) Division of application No. 10/326,778, filed on Dec. 19, 2002, now Pat. No. 6,838,038.

(60) Provisional application No. 60/341,788, filed on Dec. 21, 2001.

(51) Int. Cl.
*H01J 1/62* (2006.01)
*H01J 63/04* (2006.01)

(52) U.S. Cl. .................. 313/509; 313/504; 313/506

(58) Field of Classification Search ......... 313/503–509
See application file for complete search history.

(56) References Cited

U.S. PATENT DOCUMENTS 5,302,423 A    4/1994    Tran et al.
5,432,015 A    7/1995    Wu et al.
5,824,374 A    10/1998   Bradley, Jr. et al.
6,114,183 A    9/2000    Hamada et al.

(Continued)

FOREIGN PATENT DOCUMENTS

JP    09274989    10/1997

(Continued)

OTHER PUBLICATIONS

Liu et al., P-50: Investigation of Rare-Earth Doped Thiogallates as Potential Phosphors for TDEL Displays, *1998 SID International Symposium Digest of Technical Papers*, Aneheim, CA, May 1998, V. 29, pp. 648-651.

*Primary Examiner*—Joseph Williams
*Assistant Examiner*—Bumsuk Won
(74) *Attorney, Agent, or Firm*—Fay Sharpe LLP

(57) ABSTRACT

The invention relates to a thick film dielectric electroluminescent display having a patterned layer. The patterned layer is patterned using a laser ablation method including selecting a wavelength of laser radiation, a laser pulse length, a laser energy density and a sufficient number of laser pulses to pattern the layer without substantial ablation of or damage to other layers, whereby the wavelength of laser radiation is such that the laser radiation is substantially absorbed by the layer with minimal absorption by other layers, the laser pulse length is sufficiently short that during the duration of the laser pulse there is minimal heat flow from the layer to other layers, and the laser energy density and the sufficient number of laser pulses is sufficiently high that energy is deposited in layer, whereby at least a portion of the layer is ablated and the luminance of an unablated area of the display is comparable to the luminance of an equivalent area of an unpatterned but otherwise identical display.

16 Claims, 1 Drawing Sheet

U.S. PATENT DOCUMENTS

| | | | |
|---|---|---|---|
| 6,771,019 B1* | 8/2004 | Wu et al. | 313/503 |
| 2002/0063517 A1* | 5/2002 | Hosokawa | 313/504 |
| 2002/0094451 A1* | 7/2002 | Li et al. | 428/690 |
| 2003/0087129 A1* | 5/2003 | Miura et al. | 428/690 |

FOREIGN PATENT DOCUMENTS

| | | |
|---|---|---|
| WO | WO 98/33359 | 7/1998 |
| WO | WO 00/70917 | 11/2000 |

* cited by examiner

THICK FILM DIELECTRIC ELECTROLUMINESCENT DISPLAY HAVING PATTERNED PHOSPHOR FILM WITH ELECTRONIC BAND GAP This application claims priority to U.S. Provisional Patent Application Ser. No. 60/341,788 filed Dec. 21, 2001, and is a divisional application of U.S. Ser. No. 10/326,778, filed Dec. 19, 2002, now U.S. Pat. No. 6,838,038.

FIELD OF THE INVENTION

The present invention relates to a laser ablation method for patterning thin film layers for thick dielectric electroluminescent displays. More particularly, the invention relates to a laser ablation method for patterning thin film phosphor layers without substantial ablation of or damage to any other layers.

BACKGROUND OF THE INVENTION

Thick film dielectric electroluminescent displays (TDEL) provide a great advance in flat panel display technology. TDEL displays comprise a basic structure of, in sequence, a substrate, an electrically conductive film layer to form the lower electrode, a thick dielectric film layer, a phosphor film deposited on the thick film layer, and an optically transparent but electrically conductive film to form the upper electrode in the structure.

Various aspects of manufacturing TDEL displays are described in Applicant's co-pending U.S. patent application Ser. No. 09/747,315 filed Dec. 22, 2000; Ser. No. 09/761,971 filed Jan. 17, 2001; Ser. No. 09/867,080 filed May 29, 2001; Ser. No. 09/867,806 filed May 30, 2001 and Ser. No. 09/880,410 filed Jun. 13, 2001 as well as in Applicant's U.S. Pat. No. 5,432,015 and International Patent Applications PCT/CA01/01234 and PCT/CA00/00561. The disclosure of these aforementioned applications and issued patent are hereby incorporated by reference in their entirety into the present disclosure.

TDEL displays provide for several advantages over other types of flat panel displays including plasma displays (PDP), liquid crystal displays (LCD), thin film electroluminescent displays (TFEL), field emission displays (FED) and organic electroluminescent devices (OLED). For example, TDEL displays provide greater luminescence and greater resistance to dielectric breakdown as well as reduced operating voltage, as compared to other types of flat panel displays, such as TFEL displays. This is primarily due to the high dielectric constant of the thick film dielectric materials used in TDEL displays which facilitates the use of thick layers while still facilitating an acceptably low display operating voltage. The thick film dielectric structure, when deposited on a ceramic or other heat resistant substrate, may withstand higher processing temperatures than TFEL devices, which are typically fabricated on glass substrates. This increased temperature tolerance facilitates annealing of subsequently deposited phosphor films to improve their luminosity and stability.

Unfortunately, thick film electroluminescent displays have not achieved the phosphor luminescence and colour needed to be fully competitive with cathode ray tube (CRT) displays, particularly with recent trends in CRT specifications to higher luminescence and higher colour. Some improvement has been realized by increasing the operating voltage of the displays, but this increases the power consumption and decreases the reliability of the displays.

Further improvement in the performance of thick dielectric electroluminescent displays was realized through improved phosphor performance. For example, it is disclosed in Applicant's co-pending U.S. patent application Ser. No. 09/798,203 filed Mar. 2, 2001 (the disclosure of which is herein incorporated by reference in its entirety), that an europium activated alkaline earth containing sulfide selected from the group consisting of thioaluminates, thiooxyaluminates, thiogallates, thiooxygallates, thioindates, thiooxyindates and mixtures thereof, can be employed to provide a high luminescent blue phosphor and, thus, improve phosphor performance.

In another example, improved phosphor performance was achieved, in part, by reducing phosphor damage as a result of patterning phosphor films, such as the blue phosphors mentioned above, before they are fully formed and stabilized. For instance, a photolithographic process is described in Applicant's co-pending International Patent Application PCT/CA00/00561, (the disclosure of which is hereby incorporated by reference). A patterned phosphor film is fabricated by first depositing a uniform phosphor layer, using electron beam deposition, then patterning the phosphor film by applying a photoresist. The photoresist is exposed to a selected pattern of light using a suitable exposure mask and then selected portions of the phosphor film are etched away using a suitable etchant in order to form the required pattern. The patterning is done prior to heat treatment, when the phosphor is in a more reactive and, hence, etchable state. The problem, however, with using such a method is that the deposited patterned phosphor film is susceptable to reacting with the etchant and other chemicals used in the photolithographic process, which causes a reduction in the fully processed phosphor performance and stability. To eliminate this type of degradation, another process was used whereby the phosphor film is deposited using a shadow mask such that patterning is achieved during deposition of the phosphor film rather than after the phosphor film is deposited. This method, however, is generally not applicable to high-resolution displays whereby the required spatial definition of the patterned film exceeds that which can be achieved using shadow masks.

Other techniques to patterning films have been described in U.S. Pat. Nos. 4,970,366 and 4,970,369. These patents are directed to laser patterning of transparent electrically conductive layers in displays such as liquid crystal displays.

It is therefore desirable to improve the performance of thick dielectric electroluminescent displays, particularly the luminescence and energy efficiency of these displays, by offering a process for patterning thin films in thick dielectric electroluminescent displays which overcome the limitations of the prior art.

SUMMARY OF THE INVENTION

The present invention relates to a laser ablation method for patterning thin film layers for thick film dielectric electroluminescent displays.

According to an aspect of the invention, there is provided a laser ablation method for patterning a thin film phosphor layer of a thick film dielectric electroluminescent display having other layers, the method comprising selecting a wavelength of laser radiation, a laser pulse length, a laser energy density and a sufficient number of laser pulses to pattern the thin film phosphor layer without substantial ablation of or damage to other layers, whereby the wavelength of laser radiation is such that the laser radiation is substantially absorbed by the thin film phosphor layer with minimal absorption by other layers, the laser pulse length is sufficiently short that during the duration of the laser pulse there is minimal heat flow from the thin film phosphor layer to other layers, and the laser energy density and the sufficient number of laser pulses is sufficiently high that energy is deposited in the thin film phosphor layer, whereby the entire thickness of at least a portion of the thin film phosphor layer is ablated.

According to another aspect of the present invention is a laser ablation method for patterning a rare earth activated alkaline earth sulfide phosphor film layer within a thick film dielectric electroluminescent display comprising other layers, the method comprising:

providing a wavelength of laser radiation, a laser pulse length, a laser energy density and a sufficient number of laser pulses to said phosphor layer to effect patterning of said phosphor layer without substantial ablation of, or damage to other layers, wherein said wavelength is substantially absorbed by said phosphor layer and there is minimal heat flow from said phosphor layer to other layers, and wherein said laser energy density and number of laser pulses is sufficiently high that energy is deposited in said phosphor layer and the entire thickness of at least a portion of said phosphor layer is ablated.

In a preferred aspect, the thick film dielectric electroluminescent display comprises, in sequence, a substrate, a lower electrode layer comprising an electrically conductive metallic film, a thick film dielectric layer, a phosphor film layer deposited on the thick film dielectric layer, and an upper electrode layer comprising an optically transparent electrically conductive film. In a preferred aspect, the phosphor film layer is an alkaline earth containing sulfide activated with a rare earth metal. More preferred an europium activated alkaline earth containing sulfide selected from the group consisting of thioaluminates, thiooxyaluminates, thiogallates, thiooxygallates, thioindates, thiooxyindates and mixtures thereof.

According to yet another aspect of the invention, the method further comprises selecting a laser pulse repetition rate that is less than about 100 kHz, preferably, in the range of about 10 Hz to 1 kHz.

According to still another aspect of the invention, the method further comprises ablation of an optically transparent electrically conductive film. In a preferred aspect, the optically transparent electrically conductive film layer is an oxide, preferably, indium tin oxide.

According to still another aspect of the invention, the laser wavelength ranges of from about 193 nanometers to about 351 nanometers. In a preferred aspect, the laser is an excimer laser selected from the group consisting of krypton fluoride, xenon fluoride, xenon chloride, and argon fluoride excimer lasers.

According to yet another aspect of the invention, the thin film phosphor layer comprises a material having an electronic band gap and the laser wavelength is less than or equal to the wavelength that corresponds to the electronic band gap.

According to yet another aspect of the invention, the laser energy density is dependent on specific heat and mass per unit area of the thin film phosphor layer. In a preferred aspect, the laser energy density ranges from about 1 joule per square centimeter of surface area to about 2 joules per square centimeter of surface area and the laser pulse length is less than about 1 microsecond and preferably, at least about 20 nanoseconds.

According to yet another aspect of the invention, the thin film phosphor layer has a thickness typically in the range of about 0.3 to about 1 micrometer. In a preferred aspect, the laser ablation is conducted in an inert atmosphere, preferably, the inert atmosphere is made up of gases selected from the group consisting of argon, helium, nitrogen and mixtures thereof.

According to yet another aspect of the invention, adjacent to the thin film phosphor layer is at least one protective layer. In a preferred aspect of the invention, the at least one protective layer comprises a material that allows laser radiation to pass through to the thin film phosphor layer and/or substantially reflects back any radiation released by the thin film phosphor layer. In another preferred aspect, two protective layers are adjacent to the thin film phosphor layer such that the thin film phosphor layer is encapsulated.

According to yet another aspect of the invention, the at least one protective layer is a material selected from the group consisting of oxides and sulfides. Preferably, the material is crystalline and more preferably, selected from the group consisting of alumina, indium tin oxide, barium sulfide and mixtures thereof. In a preferred aspect of the invention, the at least one protective layer comprises a crystalline material with an optical phonon frequency range that substantially reflects radiation in a wavelength range that substantially encompasses the wavelength range of the radiation emitted from the thin film phosphor layer during ablation. In another preferred aspect, the at least one protective layer is substantially reflecting of a wavelength of radiation at least in the range of from about 1 micrometers to about 4 micrometers emitted from the thin film phosphor layer during ablation, more preferably in the range of from about 1.8 micrometers to about 3 micrometers.

According to yet another aspect of the invention, there is provided a thick film dielectric electroluminescent display comprising, in sequence, a substrate, a lower electrode layer comprising an electrically conductive metallic film, a thick film dielectric layer, a patterned phosphor film layer patterned in accordance with the method described above, and an upper electrode layer comprising an optically transparent electrically conductive film.

In a preferred aspect, a thin film layer having a thickness less than 0.5 micrometers is between the thick dielectric layer and the phosphor film layer. Preferably, the thin film layer is barium titanate. In another preferred aspect, adjacent to the phosphor film layer is at least one protective layer. Preferably, the at least one protective layer comprises a material that allows laser radiation to pass through to the thin film phosphor layer and/or substantially reflects back any radiation released by the thin film phosphor layer. More preferably, two protective layers are adjacent to the thin film phosphor layer such that the thin film phosphor layer is encapsulated. The at least one protective layer may be made from material with properties as described above.

BRIEF DESCRIPTION OF THE DRAWINGS

The present invention will become more fully understood from the description given herein, and from the accompanying drawing, which is given by way of illustration only and does not limit the intended scope of the invention.

DETAILED DESCRIPTION OF THE INVENTION

As used herein, the term "pattern" refers to a design in a thin layer. "Patterning" is the process of creating the design in a thin layer. The term "in sequence" is defined as being in a particular order but this term is not to be limiting in the sense that, for instance, in the case of layering to form a display, that the layers be adjacent to one another.

Figure 1:
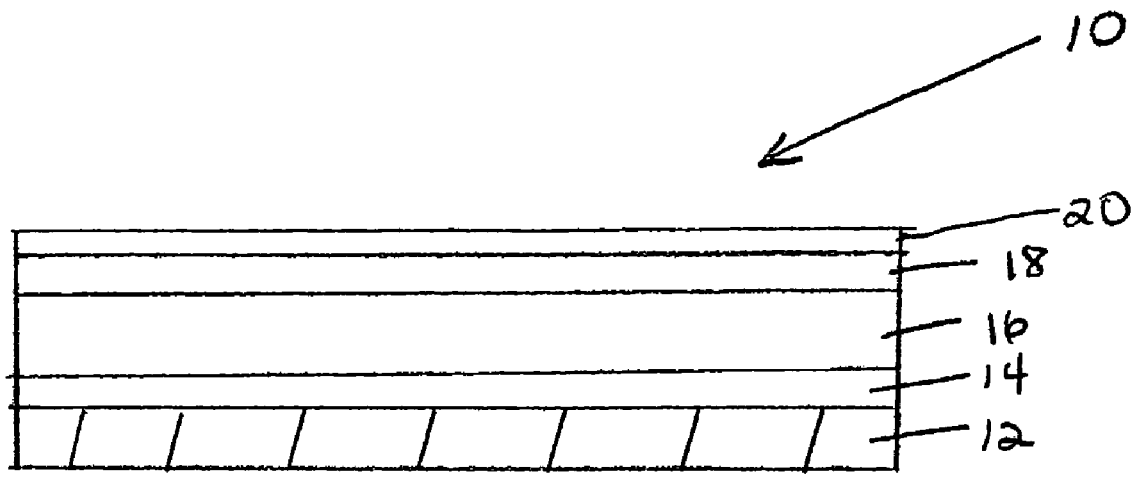
FIG. 1 shows a section of a thick film dielectric electroluminescent element display.

The present invention relates to a laser ablation method for patterning thin film layers for thick film dielectric electroluminescent displays without substantial ablation of or damage to other layers. A typical thick dielectric electroluminescent display 10 is shown in FIG. 1. The thick electroluminescent display 10 comprises a basic structure of, in sequence, a substrate 12, an electrically conductive film layer to form the lower electrode 14, a thick dielectric film layer 16, a phosphor film 18, and an optically transparent but electrically conductive film 20 to form the upper electrode in the structure. The substrate 12 is preferably a heat resistant substrate such as ceramic, glass ceramic composite, high temperature glass, ceramic coated metal, or any other rigid material that will withstand the processing temperatures. The lower electrode 14 is preferably gold or silver. The lower electrode is preferably deposited on the substrate prior to deposition of the thick dielectric structure. The thick dielectric film layer 16 is designed to provide high resistance against dielectric breakdown when the display is operated at the voltage required to produce the display luminescence. Typically, the thick dielectric film layer 16 comprises a sintered perovskite, piezoelectric or ferroelectric material such as lead magnesium niobate-titanate (PMN-PT) with a dielectric constant of several thousand and a thickness greater than about 10 micrometers to prevent dielectric breakdown. The phosphor film 18 typically comprises a sulfide containing phosphor such as an alkaline earth containing sulfide, for instance, an alkaline earth containing sulfide activated with a rare earth metal, preferably, an europium activated alkaline earth containing sulfide selected from the group consisting of thioaluminates, thiooxyaluminates, thiogallates, thiooxygallates, thioindates, thiooxyindates and mixtures thereof. The upper electrode 20 is a transparent electrically conductive layer, typically, an oxide such as indium tin oxide (ITO). Typically, another thin layer is placed between the thick dielectric film layer and the phosphor layer, as described in International patent application PCT/CA00/00561, hereby incorporated by reference. Preferably this other thin film layer has a thickness less than 0.5 micrometers and, more preferably, this other thin film layer is barium titanate.

Figure 2:
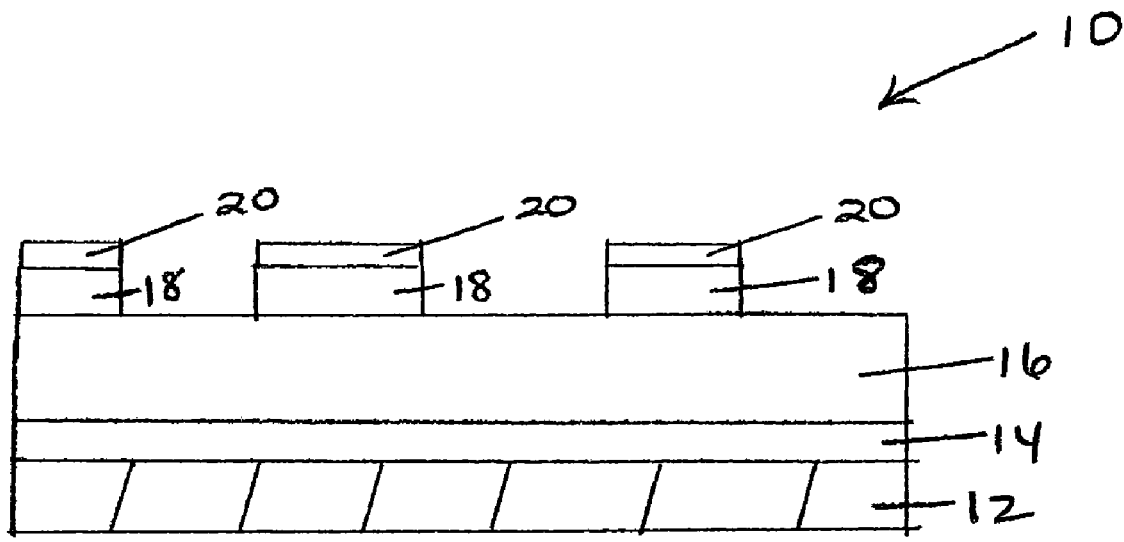
FIG. 2 shows a section of a thick film dielectric electroluminescent element display with patterned layers.

In embodiments, the laser ablation method relates to patterning thin film phosphor layers 18 without substantial ablation of or damage to any other layer. In related embodiments, the laser ablation method is directed to patterning thin film phosphor layers 18 and transparent electrically conductive layers 20 without substantial ablation of or damage to any other layer (see FIG. 2).

In general, the method involves irradiating the layer to be ablated above a temperature at which it can be vaporized while limiting the transfer of heat energy to any other layer. This prevents, for instance, the immediately adjacent thin film from melting, undergoing chemical reactions within itself, with the layer to be ablated, or any other portion of the structure that may result in significant degradation of the electroluminescent display.

In preferred embodiments, the method of laser ablation entails the selection of a wavelength of the laser radiation, a laser pulse length, a laser energy density and a sufficient number of laser pulses delivered to a specific area of the film to be ablated to obtain a patterned layer. These parameters are selected to be compatible with the physical properties of the layer to be ablated and any other layer not to be ablated. These properties may include the optical absorption coefficient and optical index of refraction of the layer to be ablated at the specific laser wavelength and any other layer not to be ablated at the specific wavelength; the heat capacity of the layer to be ablated and the heat capacity of any other layer not to be ablated; and the thermal conductivity of the layer to be ablated and the thermal conductivity of any other layer not to be ablated.

In one embodiment, the laser ablation method comprises a) selecting a laser wavelength such that the laser radiation is substantially absorbed within the layer to be ablated and any radiation not absorbed by this layer dissipates without substantial absorption by any other layer, for example, the radiation that is not absorbed is reflected from the interface between the layer to be ablated and an underlying thin film; b) selecting a laser pulse length such that it is sufficiently short that during the duration of a laser pulse there is no substantial heat flow from the layer to be ablated to any other layer, in particular, any underlying thin film; c) selecting a laser energy density of the laser pulse such that it is sufficiently high that energy is deposited in the layer to vaporize the entire thickness of at least a portion of the layer; d) selecting a sufficient number of laser pulses and a laser pulse repetition rate such that it is sufficiently high that energy is deposited in the layer to vaporize the entire thickness of at least a portion of the layer. For instance, if the layer to be ablated is only partially ablated using a single laser pulse, then a sequence of pulses may be used to completely ablate the layer, if that is the user's choice.

Preferably, the laser wavelength is less than or equal to the corresponding electronic band gap of the material of the layer being ablated. The electronic band gap may be influenced by the presence of impurities, defects in the crystallinity structure of the material, and grain boundaries in the material. For instance, the layer to be ablated may comprise more than one chemical compound or crystalline phase, and in this case, the band gap of the other constituent materials may need to be taken into account. Similarly, the radiation that is not absorbed and is reflected, for instance, from the interface between the layer to be ablated and the underlying layer, may be affected by the presence of impurities, the grain structure and other morphological features of the materials of the layers. The thermal conductivity of the layer to be ablated and any other layer not to be ablated may also be influenced by the grain structure and physical morphology of the other constituent materials of these layers. In preferred embodiments, laser wavelengths for ablation are in the range of from about 193 nanometers to about 351 nanometers. To achieve this selected wavelength range, excimer lasers may be used. More preferably, these lasers are selected from the group consisting of krypton fluoride, xenon fluoride, xenon chloride, and argon fluoride excimer lasers.

Preferably, the laser pulse length is at least about 20 nanoseconds and, more preferably, less than about one microsecond such that there is no undue heating of any other layer underlying the layer to be ablated. The layer to be ablated has a thickness typically in the range of about 0.3 to about 1 micrometer.

Preferably, the laser energy density is dependent on specific heat and mass per unit area of the layer to be ablated. Typically, a energy density of between about 1 joule per square centimeter of surface area and 2 joules per square centimeter of surface area are required for clean ablation. Excimer lasers can typically deliver a energy density in excess of 3 joules per square centimeter.

Preferably, the pulse repetition rate is less that about 100 kHz. Most commercially produced excimer lasers typically have a pulse repetition rate in the range of about 10 Hz to 1 kHz. If the repetition rate is too high, the heat from an incident laser pulse will not have dissipated into the layer before another pulse arrives, which may result in possible overheating of the other layers, in particular, the layer underlying the layer to be ablated.

In preferred embodiments, the laser ablation is conducted in an essentially inert atmosphere. Typically, the inert atmosphere is made up of gases selected from the group consisting of argon, helium, nitrogen and mixtures thereof.

To successfully ablate a layer, it is desirable to be able to control the temperature distribution of the layer to be ablated to achieve a clean ablation of the material. For example, if the surface of the material solidifies while material below is molten or vaporized, the material may not be cleanly ablated, and portions of it may re-condense or solidify. If this happens, the ablated region may have condensed and solidified debris scattered randomly over it. In order to control the temperature distribution of the layer to be ablated and to achieve a clean ablation of the material, a protective layer may be used. In one embodiment, a protective layer may be deposited on top of the layer to be ablated. The protective layer permits laser radiation to pass through to the layer to be ablated and the protective layer substantially reflects back any radiation released by the layer being ablated. Similarly, a protective layer may be positioned below the layer to be ablated so that any radiation released by the layer being ablated is substantially reflected back. In addition, the layer to be ablated may be encapsulated with a protective layer. For instance, the protective layer is positioned on top and below the layer to be ablated. Preferably, the combined thickness of the layer to be ablated and the protective layer is in the range of about 0.3 to about 1.5 micrometers.

The protective layers are selected so that they are compatible with the electroluminescent display and the remainder of the display processing steps following the ablation steps, since the protective layers remain in place after ablation. In embodiments incorporating the protective layer, the method preferably entails the selection of a choice of materials and thickness for the protective layer, a wavelength of the laser radiation, a laser pulse length, a laser energy density, a pulse repetition rate and a total number of pulses delivered to a specific area of the film to be ablated to achieve this result. The protective layer is typically a material that permits laser radiation to pass through to the layer to be ablated and substantially reflects back any radiation released by the layer being ablated, preferably the material is a crystalline material. Typically, the protective layer comprises compounds containing light atoms such as oxides and/or sulfides, preferably having a relatively high degree of ionic bonding within the crystal lattice. More preferably, the protective layer is selected from the group consisting of alumina, indium tin oxide, barium sulfide and mixtures thereof.

In preferred embodiments, the protective layer is a crystalline material having a wide range of optical phonon frequencies such that it is capable of substantially reflecting back the wavelength range of radiation, in particular black body radiation, emitted by the layer to be ablated as it approaches its vaporization temperature. The term optical phonon is as defined in C. Kittel, *Introduction to Solid State Physics Third edition*, Chapter 5. In particular, the protective layer comprises a material with an optical phonon frequency range such that it substantially reflects radiation in a wavelength range that substantially encompasses the wavelength range of the radiation, in particular black body radiation, emitted from the ablated material during the ablation process. In particular embodiments, the protective layer is chosen to substantially reflect back to the phosphor layer a black body radiation wavelength at least in the range of about 1 micrometers to about 4 micrometers, preferably about 1.8 micrometers to about 3 micrometers.

The protective layer can also protect the layer from environmental degradation. For instance, the protective layer can protect the unablated portion from the atmosphere and, thus, any moisture therefrom.

In particular embodiments whereby the layer to be ablated is a phosphor, the vaporization temperature at which ablation occurs is typically in the range of about 1500° C. to about 2500° C. To avoid reduction of the vaporization temperature as radiation (ie. black body radiation) is released from the phosphor layer, a protective layer is chosen that will substantially reflect back to the phosphor layer the black body radiation in the wavelength range emitted from the phosphor layer. With respect to a phosphor with a vaporization temperature typically in the range of about 1500° C. to about 2500° C., the wavelength of the black body radiation emitted from the phosphor layer at these temperatures about is predominantly in the wavelength range of about 1.8 micrometers to about 3 micrometers, which is in the infrared region of the electromagnetic spectrum. Therefore, the protective layer is chosen to substantially reflect back to the phosphor layer a black body radiation wavelength at least in the range of about 1.8 micrometers to about 3 micrometers.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLES

The electroluminescent displays in the following examples were fabricated by depositing and patterning thin film layers on a 5 centimeter by 5 centimeter alumina substrate upon which was deposited, in sequence, a thin film gold electrode and a composite thick film dielectric layer, according to the methods of Applicant's co-pending International patent application PCT/CA00/00561 (the entirety of which is incorporated herein by reference). A barium titanate thin film dielectric layer is then deposited thereon, according to the method of Applicant's co-pending U.S. patent application Ser. No. 09/761,971 filed Jan. 17, 2001 (the entirety of which is incorporated herein by reference). Following the deposition of the barium titanate film, a phosphor film layer was deposited thereon using the method of Applicant's co-pending U.S. patent application Ser. No. 09/798,203 filed Mar. 2, 2001, (the entirety of which is incorporated herein by reference). The phosphor layer comprises an europium activated magnesium barium thioaluminate with three atomic percent europium based on the ratio of europium to magnesium and barium.

Ablation was achieved using an excimer laser focused onto the phosphor film layer of the display in a square spot of variable dimensions, in particular, 260 micrometers by 260 micrometers. The laser pulse length was 20 nanoseconds. The display was moved beneath the spot in a direction perpendicular to the laser beam so that the spot was scanned across the phosphor layer at a rate of up to 300 centimeters per minute. The scanning rate was chosen so that sequential laser pulses overlapped so that repeated ablated spots formed an ablated trench. Several parallel trenches were ablated so that the phosphor film layer was divided into parallel strips. The repetition rate was varied so that each point in the ablated trench was subjected to at least two and up to five laser pulses.

Following ablation of the phosphor film layer, an additional thin film layer of alumina was deposited thereon, followed by the deposition of a transparent electrode layer of indium tin oxide. It is possible that these layers may already be deposited prior to the ablation process, wherein the alumina acts as the protective layer to protect the ablated layer and any other layers.

The resulting electroluminescent displays were then tested by applying alternating polarity voltage pulses with an amplitude of 60 volts above the threshold value, a pulse width of 32 microseconds and a pulse repetition rate of 240 Hz.

Example 1

A thick film electroluminescent display was made as described above, wherein the europium activated magnesium barium thioaluminate phosphor film layer is about 270 nanometers thick and the underlying layer of barium titanate is about 15 nanometers thick. To the top of the phosphor film layer was sputtered a protective layer of alumina, which is about 45 nanometers thick, followed by a layer of indium tin oxide, which is about 100 nanometers thick. The indium tin oxide acts as both an electrode and protective layer for the display.

The phosphor film layer together with the overlying layers were ablated using an excimer laser having a laser wavelength of 248 nanometers, a laser energy density of 1.5 joules per square centimeter and a laser pulse repetition rate to give a pulse every 26 micrometers along the ablation path.

This resulted in a phosphor film layer that could be independently illuminated by applying a voltage between the gold electrode and the indium tin oxide layer. The luminosity of the phosphor was measured and it was found that the unablated area was comparable to that of an unpatterned but otherwise identical device.

Example 2

A display similar to that of Example 1 was fabricated, except that the laser energy density was higher at 2 joules per square centimeter and the laser pulse repetition rate was lower so that there was a pulse applied every 52 micrometers along the ablation trench.

This display performed similarly to that of Example 1.

Although preferred embodiments of the invention have been described herein in detail, it will be understood by those skilled in the art that variations may be made thereto without departing from the spirit of the invention.

We claim:

1. A laser ablated thick film dielectric electroluminescent display comprising in sequence, a substrate, a lower electrode layer, a thick film dielectric layer, a phosphor film layer, and an upper electrode layer, wherein at least one layer has been patterned by a laser ablation method whereby at least a portion of the layer is ablated without substantial ablation of or damage to other layers, and the unablated area of the electroluminescent display continues to exhibit luminance comparable to the luminance of an unpatterned but otherwise identical display and wherein the patterned layer comprises a material having an electronic band gap and the laser wavelength is less than or equal to the wavelength that corresponds to the electronic band gap.

2. A laser ablated thick film dielectric electroluminescent display according to claim 1, wherein the phosphor film layer is an alkaline earth containing sulfide activated with a rare earth metal.

3. A laser ablated thick film dielectric electroluminescent display according to claim 2, wherein the alkaline earth containing sulfide activated with a rare earth metal is a europium activated alkaline earth containing sulfide selected from the group consisting of thioaluminates, thiooxyaluminates, thiogallates, thiooxygallates, thioindates, thiooxyindates and mixtures thereof.

4. A laser ablated thick film dielectric electroluminescent display according to claim 1, wherein the laser ablation method includes ablation by a laser having a wavelength that ranges of from about 193 nanometers to about 351 nanometers.

5. A laser ablated thick film dielectric electroluminescent display according to claim 4, wherein the laser is an excimer laser selected from the group consisting of krypton fluoride, xenon fluoride, xenon chloride, and argon fluoride excimer lasers.

6. A laser ablated thick film dielectric electroluminescent display according to claim 1, wherein the laser energy density applied during the laser ablation method is dependent on specific heat and mass per unit area of the phosphor film layer.

7. A laser ablated thick film dielectric electroluminescent display according to claim 6, wherein the laser energy density ranges from about 1 joule per square centimeter of surface area to about 2 joules per square centimeter of surface area.

8. A laser ablated thick film dielectric electroluminescent display according to claim 1, wherein the laser pulse length applied during the laser ablation method is less than about 1 microsecond.

9. A laser ablated thick film dielectric electroluminescent display according to claim 1, wherein the phosphor film layer has a thickness typically in the range of about 0.3 to about 1 micrometer.

10. A laser ablated thick film dielectric electroluminescent display according to claim 1, wherein a thin film layer having a thickness less than 0.5 micrometers is added between the thick dielectric layer and the phosphor film layer.

11. A laser ablated thick film dielectric electroluminescent display according to claim 10, wherein the thin film layer is barium titanate.

12. A laser ablated thick film dielectric electroluminescent display according to claim 1, wherein adjacent to the patterned layer is at least one protective layer.

13. A laser ablated thick film dielectric electroluminescent display according to claim 12, wherein the at least one protective layer comprises a material selected from the group consisting of oxides and sulfides.

14. A laser ablated thick film dielectric electroluminescent display according to claim 12, wherein the at least one protective layer comprises a crystalline material with an optical phonon frequency range that substantially reflects radiation in a wavelength range that substantially encompasses the wavelength range of the radiation emitted from the patterned layer during ablation.

15. A laser ablated thick film dielectric electroluminescent display according to claim 1 wherein the patterned layer is an upper electrode layer.

16. A laser ablated thick film dielectric electroluminescent display according to claim 1 wherein the patterned layer is one or more layers.

* * * * *